(12) United States Patent
Sim et al.

(10) Patent No.: US 7,888,219 B2
(45) Date of Patent: Feb. 15, 2011

(54) METHODS OF FORMING CHARGE-TRAP TYPE NON-VOLATILE MEMORY DEVICES

(75) Inventors: Jae-Sung Sim, Gyeonggi-do (KR); Jung-Dal Choi, Gyeonggi-do (KR); Chang-Seok Kang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/766,272

(22) Filed: Apr. 23, 2010

(65) Prior Publication Data
US 2010/0221886 A1 Sep. 2, 2010

Related U.S. Application Data

(62) Division of application No. 11/724,870, filed on Mar. 16, 2007, now Pat. No. 7,732,856.

(30) Foreign Application Priority Data
Apr. 26, 2006 (KR) ................................ 2006-37805

(51) Int. Cl.
*H01L 21/336* (2006.01)
(52) U.S. Cl. ........................ 438/287; 438/288; 438/258; 257/324; 257/326; 257/411; 257/E29.309; 257/E21.18
(58) Field of Classification Search ................. 438/287, 438/288, 258; 257/324, 326, 411, E29.309, 257/E21.18
See application file for complete search history.

(56) References Cited

U.S. PATENT DOCUMENTS
5,970,363 A * 10/1999 Kepler et al. ................. 438/435
(Continued)

FOREIGN PATENT DOCUMENTS
JP 2004-273738 9/2004
(Continued)

OTHER PUBLICATIONS
Notice of Allowance for Korean Application No. 10-2006-0037805; Sep. 10, 2007.
(Continued)

*Primary Examiner*—Tu-Tu V Ho
(74) *Attorney, Agent, or Firm*—Myers Bigel Sibley & Sajovec, P.A.

(57) ABSTRACT

Methods of forming a non-volatile memory device may include forming a tunnel insulating layer on a semiconductor substrate and forming a charge-trap layer on the tunnel insulating layer. A trench may then be formed extending through the tunnel insulating layer and the charge-trap layer and into the semiconductor substrate so that portions of the charge-trap layer and the tunnel insulating layers remain on opposite sides of the trench. A device isolation layer may be formed in the trench, and a blocking insulating layer may be formed on the device isolation layer and on remaining portions of the charge-trap layer. A gate electrode may be formed on the blocking insulating layer, and the blocking insulating layer and remaining portions of the charge-trap layer may be patterned to provide a blocking insulating pattern and a charge-trap pattern between the gate electrode and the semiconductor substrate.

17 Claims, 11 Drawing Sheets

U.S. PATENT DOCUMENTS

| | | |
|---|---|---|
| 6,019,806 A | 2/2000 | Sees et al. |
| 6,784,055 B2 | 8/2004 | Shin et al. |
| 7,031,193 B2 | 4/2006 | Micheloni et al. |
| 7,078,762 B2 | 7/2006 | Ishii et al. |
| 2002/0130350 A1 | 9/2002 | Shin et al. |
| 2003/0001196 A1 | 1/2003 | Choi et al. |
| 2003/0062567 A1 | 4/2003 | Zheng et al. |
| 2003/0193827 A1 | 10/2003 | Choi |
| 2003/0198106 A1 | 10/2003 | Choi |
| 2005/0002231 A1 | 1/2005 | Ozawa et al. |
| 2005/0088889 A1 | 4/2005 | Lee et al. |
| 2005/0180210 A1 | 8/2005 | Harari et al. |
| 2006/0035432 A1 | 2/2006 | Kim et al. |
| 2006/0285375 A1 | 12/2006 | Endo et al. |

FOREIGN PATENT DOCUMENTS

| | | |
|---|---|---|
| KR | 1020030081896 | 10/2003 |
| KR | 1020050117443 | 12/2005 |
| KR | 1020060015182 | 2/2006 |
| KR | 1020060081623 | 7/2006 |

OTHER PUBLICATIONS

English translation of Notice of Allowance for Korean Application No. 10-2006-0037805; Sep. 10, 2007.

Eitan et al., "4-bit per Cell NROM Reliability", IEEE, Saifun Semiconductors, Ltd., 4 pages, (2005).

Kauerauf et al., "Low Weibull Slope of Breakdown Distributions in High-k Layers", IEEE Electron Device Letters, 23:4, pp. 215-217 (Apr. 2002).

Lusky et al., "Electrons Retention Model for Localized Charge in Oxide-Nitride-Oxide (ONO) Dielectric", IEEE Electron Device Letters, 23:9, pp. 556-558 (Sep. 2002).

Shin et al., "A Novel NAND-type MONOS Memory using 63nm Process Technology for Multi-Gigabit Flash EEPROMs", Samsung Electronics Co., Ltd., IEEE, 4 pages (2005).

Willer et al., "110nm NROM Technology for Code and Data Flash Products", 2004 Symposium on VLSI Technology—Digest of Technical Papers, pp. 76-77 (2004).

Zous et al., "Lateral Migration of Trapped Holes in a Nitride Storage Flash Memory Cell and Its Qualification Methodology", IEEE Electron Device Letters, 25:9, pp. 649-651 (Sep. 2004).

* cited by examiner

US 7,888,219 B2

METHODS OF FORMING CHARGE-TRAP TYPE NON-VOLATILE MEMORY DEVICES

RELATED APPLICATIONS

This U.S. non-provisional patent application claims the benefit of priority as a divisional of U.S. application Ser. No. 11/724,870, filed on Mar. 16, 2007 now U.S. Pat. No. 7,732, 856, which claims priority under 35 U.S.C. §119 of Korean Patent Application No. 2006-37805, filed on Apr. 26, 2006. The disclosures of both of the above referenced applications are hereby incorporated herein by reference in their entirety.

FIELD OF THE INVENTION

The present invention relates generally to semiconductor devices, and more particularly, to non-volatile memory devices and methods of forming the same.

BACKGROUND

Non-volatile memory devices may be classified into two basic types, floating gate type non-volatile memory devices, and charge-trap type non-volatile memory devices. A floating gate type non-volatile memory device stores electrical charges in a floating gate as free carriers, and a charge-trap type non-volatile memory device stores electrical charges in spatially-isolated traps within a charge-trap layer.

A floating gate type non-volatile memory device may provide lower integration (device density) because of a height of a floating gate. Moreover, as a floating gate type non-volatile memory semiconductor device is more highly integrated, distances between floating gates are shortened, and defective operations may occur due to an interference effect between the floating gates. Also, since a floating gate type non-volatile memory device stores electrical charges as free carriers, a floating gate type non-volatile memory device may require a thick tunnel insulating layer as compared to a charge-trap type non-volatile memory device. Accordingly, a floating gate type non-volatile memory device may consume more power than a charge-trap type non-volatile memory device.

An example of a conventional charge-trap type non-volatile memory device is a silicon-oxide-nitride-oxide-silicon (SONOS) memory device. A SONOS memory device uses polysilicon as a gate electrode, silicon oxide as a tunnel-insulating layer and as a blocking insulating layer, and silicon nitride as a charge-trap layer between two insulating layers.

Electrical charges that are once trapped in the silicon nitride layer providing charge-trapping may not significantly move horizontally. Accordingly, at least two adjacent memory cell transistors may share a charge-trap layer in a conventional SONOS memory device. Recent research has revealed, however, that some charge in the silicon nitride layer may move horizontally. Horizontal movement of electrical charge may cause loss of charge, thereby changing a threshold voltage of a memory cell transistor.

In a conventional SONOS memory device, when an erase operation is performed by discharging electrical charge trapped in the charge-trap layer to a semiconductor substrate, a negative voltage may be applied to word lines. Here, since both of the blocking insulating layer and the tunnel-insulating layer are formed of silicon oxide, dielectric constants of the two layers may be the same, and thus almost the same electric field may be provided at the two insulating layers, causing back tunneling. For this reason, charge trapped in the charge-trap layer may not be completely discharged, and may stay in the charge-trap layer. To reduce occurrence of this defective erase operation, the blocking insulating layer may be made of a high-dielectric material having a greater dielectric constant than that of silicon oxide, and the gate electrode may be made of a material having a higher work function than that of polysilicon. When the blocking insulating layer formed of the high dielectric material is etched, however, the blocking insulating layer may be damaged by a plasma generated during dry-etching, which may generate defects on a sidewall of the blocking insulating layer. Problems such as breakdown voltage drop may thus result, thereby reducing reliability of the charge-trap type non-volatile memory device.

SUMMARY

According to some embodiments of the present invention, a method of forming a non-volatile memory device may include forming a tunnel insulating layer on a semiconductor substrate, and forming a charge-trap layer on the tunnel insulating layer. A trench may be formed extending through the tunnel insulating layer and the charge-trap layer and into the semiconductor substrate so that portions of the charge-trap layer and the tunnel insulating layers remain on opposite sides of the trench. A device isolation layer may be formed in the trench, and a blocking insulating layer may be formed on the device isolation layer and on remaining portions of the charge-trap layer. A gate electrode may be formed on the blocking insulating layer, and the blocking insulating layer and remaining portions of the charge-trap layer may be patterned to provide a blocking insulating pattern and a charge-trap pattern between the gate electrode and the semiconductor substrate.

The blocking insulating layer may include a layer of a material having a dielectric constant higher than that of silicon oxide. The gate electrode may include a material having a work function higher than that of polysilicon, and more particularly, the gate electrode may include a metal.

Before forming the trench, a passivation layer may be formed on the charge-trap layer and a planarization stop layer may be formed on the passivation layer, so that forming the trench further includes forming the trench through the planarization stop layer and the passivation layer. Moreover, forming the device isolation layer may include forming an insulating layer on remaining portions of the planarization stop layer and in the trench, planarizing the insulating layer to expose the planarization stop layer while maintaining portions of the insulating layer in the trench, and removing the planarization stop layer and the passivation layer. In addition, removing the passivation layer may include removing a portion of the device isolation layer.

The charge-trap pattern may be recessed relative to a surface of the device isolation layer opposite the substrate. The semiconductor substrate may include a cell array region and a peripheral circuit region, and before forming the blocking insulating layer, portions of the charge-trap layer on the peripheral circuit region of the semiconductor substrate may be removed while maintaining portions of the charge-trap layer on the cell array region of the semiconductor substrate. In addition, before patterning the blocking insulating layer and remaining portions of the charge-trap layer, spacers may be formed on sidewalls of the gate electrode, and patterning the blocking insulating layer and remaining portions of the charge-trap layer may include patterning the blocking insulating layer and remaining portions of the charge-trap layer using the spacers as an etch mask.

According to some other embodiments of the present invention, a method of forming a non-volatile memory device may include forming a device isolation layer on portions of a semiconductor substrate separating first and second active regions of the semiconductor substrate on opposite sides of the device isolation layer. First and second tunnel insulating patterns may be formed on the first and second active regions of the semiconductor substrate, and first and second charge-trap patterns may be formed on the respective first and second tunnel insulating patterns. Moreover, portions of the device isolation layer between the first and second charge-trap patterns may be free of the first and second charge-trap patterns, and a word line may be formed on the first and second charge-trap patterns and on portions of the device isolation layer between the first and second charge-trap patterns.

In addition, a blocking insulating layer may be formed on the first and second charge-trap patterns and on the device isolation layer so that the blocking insulating layer is between the word line and the first and second charge-trap patterns and between the word line and the device isolation layer. More particularly, the tunnel insulating layer may include a layer of a first insulating material having a first dielectric constant, the blocking insulating layer may include a layer of a second insulating material having a second dielectric constant, and the first dielectric constant may be less than the second dielectric constant.

Each of the first and second charge-trap patterns may have a respective sidewall directly adjacent respective sidewalls of the device isolation layer. The word line may include a material having a work function higher than that of polysilicon, and more particularly, the word line may include a metal. A surface of the device isolation layer opposite the semiconductor substrate may extend at least as far from the semiconductor substrate as surfaces of the charge-trap patterns opposite the semiconductor substrate. In other words, the charge-trap patterns may be recessed relative to the device isolation layer.

The semiconductor substrate may include a cell array region and a peripheral circuit region and the word line may be on the cell array region. In addition, a peripheral circuit gate insulating layer may be formed on a peripheral circuit region of the semiconductor substrate, and a peripheral circuit gate electrode may be formed on the peripheral circuit gate insulating layer so that the peripheral circuit gate insulating layer is between the peripheral circuit gate electrode and the peripheral circuit region of the semiconductor substrate. Moreover, a separation between the peripheral circuit gate electrode and the peripheral circuit region of the semiconductor substrate may be less than a separation between the word line and the first and second active regions of the semiconductor substrate.

First and second selection gate insulating patterns may be formed on the first and second active regions spaced apart from the first and second tunnel insulating patterns. In addition, a selection line may be formed on the first and second selection gate insulting patterns and on portions of the device isolation layer between the first and second selection gate insulating patterns. Moreover, a separation between the selection line and the first and second active regions of the semiconductor substrate may be less than a separation between the word line and the first and second active regions of the semiconductor substrate. Spacers may also be formed on sidewalls of the word line, and the first and second charge-trap patterns may be between the spacers and the semiconductor substrate in a direction perpendicular with respect to a surface of the semiconductor substrate.

According to still other embodiments of the present invention, a non-volatile memory device may include a semiconductor substrate and a device isolation layer on the semiconductor substrate separating first and second active regions of the semiconductor substrate on opposite sides of the device isolation layer. First and second tunnel insulating patterns may be on the first and second active regions, and first and second charge-trap patterns may be on the respective first and second tunnel insulating patterns. More particularly, portions of the device isolation layer between the first and second charge-trap patterns may be free of the first and second charge-trap patterns. A word line may also be on the first and second charge-trap patterns and on portions of the device isolation layer between the first and second charge-trap patterns.

In addition, a blocking insulating layer may be between the word line and the first and second charge-trap patterns and between the word line and the device isolation layer. Moreover, the tunnel insulating layer may include a layer of a first insulating material having a first dielectric constant, the blocking insulating layer may include a layer of a second insulating material having a second dielectric constant, and the first dielectric constant may be less than the second dielectric constant.

Each of the first and second charge-trap patterns may have a respective sidewall directly adjacent respective sidewalls of the device isolation layer. The word line may include a material having a work function higher than that of polysilicon, and more particularly, the word line may include a material including metal. A surface of the device isolation layer opposite the semiconductor substrate may extend at least as far from the semiconductor substrate as surfaces of the charge-trap patterns opposite the semiconductor substrate.

The semiconductor substrate may include a cell array region and a peripheral circuit region and the word line may be on the cell array region. In addition, a peripheral circuit gate insulating layer may be on a peripheral circuit region of the semiconductor substrate, and a peripheral circuit gate electrode may be on the peripheral circuit gate insulating layer so that the peripheral circuit gate insulating layer is between the peripheral circuit gate electrode and the peripheral circuit region of the semiconductor substrate. Moreover, a separation between the peripheral circuit gate electrode and the peripheral circuit region of the semiconductor substrate may be less than a separation between the word line and the first and second active regions of the semiconductor substrate. In addition, spacers may be provided on sidewalls of the peripheral circuit gate electrode, and the peripheral circuit gate insulating layer may be between the spacers and the semiconductor substrate in a direction parallel with respect to a surface of the semiconductor substrate.

First and second selection gate insulating patterns on the first and second active regions may be spaced apart from the first and second tunnel insulating patterns, and a selection line may be on the first and second selection gate insulting patterns and on portions of the device isolation layer between the first and second selection gate insulating patterns. Moreover, a separation between the selection line and the first and second active regions of the semiconductor substrate may be less than a separation between the word line and the first and second active regions of the semiconductor substrate. Spacers may be on sidewalls of the selection line, and the first and second selection gate insulating patterns may be between the spacers and the semiconductor substrate in a direction parallel with respect to a surface of the semiconductor substrate.

In addition, spacers may be provided on sidewalls of the word line, and the first and second charge-trap patterns may be between the spacers and the semiconductor substrate in a direction perpendicular with respect to a surface of the semiconductor substrate.

Some embodiments of the present invention may provide charge-trap type non-volatile memory devices having improved reliability, and a methods of forming the same.

According to some embodiments of the present invention, a charge-trap type non-volatile memory device may include a semiconductor substrate and a tunnel insulating layer and a charge-trap layer sequentially stacked on the semiconductor substrate. A device isolation layer may pass through portions of the charge-trap layer, the tunnel insulating layer, and the semiconductor substrate to define an active region. A word line may be formed across the semiconductor substrate and may intersect the device isolation layer. A blocking insulating layer may be interposed between the word line and the charge-trap layer and between the word line and the device isolation layer.

The blocking insulating layer may be formed of a material having a higher dielectric constant than that of silicon oxide. The gate electrode layer may be a metal containing layer. The gate electrode layer may be formed of a material having a higher work function than that of polysilicon. The device isolation layer may have a top surface higher than or on the same level as a top surface of the charge-trap layer.

The semiconductor substrate may include a cell array region and a peripheral circuit region, and the word line may be placed in the cell array region. The device may further include a peripheral circuit gate insulating layer and a peripheral circuit gate electrode sequentially stacked on the semiconductor substrate in the peripheral circuit region. Here, the peripheral circuit gate insulating layer may include at least one of the blocking insulating layer and the tunnel insulating layer, but not include the charge-trap layer.

The device may further include a selection line placed on the semiconductor substrate in the cell array region with the selection line being parallel to the word line, and a selection gate insulating layer interposed between the selection line and the semiconductor substrate. The selection gate insulating layer may include at least one of the blocking insulating layer and the tunnel insulating layer, but not the charge-trap layer.

The device may further include a spacer covering a sidewall of the word line, and the blocking insulating layer, the charge-trap layer, and the tunnel insulating layer may have sidewalls aligned with an outer lower end of the spacer. The blocking insulating layer may contact a bottom surface of the spacer.

The device may also include a spacer covering a sidewall of the peripheral circuit gate electrode, and the peripheral circuit gate insulating layer may contact a bottom surface of the spacer and have a sidewall aligned with an outer lower end of the spacer.

The device may further include a spacer covering a sidewall of the selection line. The selection gate insulating layer may contact a bottom surface of the spacer and may have a sidewall aligned with an outer lower end of the spacer.

According to some other embodiments of the present invention, a method of forming a charge-trap type non-volatile memory device may include sequentially forming a tunnel insulating layer and a charge-trap layer on a semiconductor substrate. Portions of the charge-trap layer, the tunnel insulating layer, and the semiconductor substrate may be etched to form a trench, and a device isolation layer may be formed to fill the trench. A blocking insulating layer may be formed on an entire surface of the semiconductor substrate including the device isolation layer. A gate electrode layer may be formed on the blocking insulating layer, and the gate electrode layer may be patterned to form a gate electrode on the blocking insulating layer. The blocking insulating layer, the charge-trap layer and the tunnel insulating layer may be sequentially patterned to form a tunnel insulating layer pattern, a charge-trap layer pattern and a blocking insulating layer pattern that are sequentially stacked.

Before the etching of the portions of the charge-trap layer, the tunnel insulating layer and the semiconductor substrate to form the trench, a passivation layer may be formed on the charge-trap layer, and a planarization stop layer may be formed on the passivation layer. Here, forming the trench may include etching portions of the planarization stop layer, the passivation layer, the charge-trap layer, the tunnel insulating layer, and the semiconductor substrate.

Forming the device isolation layer may include forming an insulating layer on an entire surface of the semiconductor substrate including the trench to fill the trench with the insulating layer and performing a planarization process on the insulating layer to expose the planarization stop layer and simultaneously form a temporary device isolation layer within the trench. The temporary device isolation layer may have a same height as that of the planarization stop layer. A portion of a top surface of the temporary device isolating layer may be recessed to partially expose a side surface of the planarization stop layer and to simultaneously form the device isolation layer within the trench. The planarization stop layer and the passivation layer may then be removed.

Removing the passivation layer may include removing a portion of a top surface, of the device isolation layer. The semiconductor substrate may include a cell array region and a peripheral circuit region, and the charge-trap layer in the peripheral region may be removed before the forming the blocking insulating layer.

In addition, a spacer may be formed covering a sidewall of the gate electrode before sequentially patterning the blocking insulating layer, the charge-trap layer, and the tunnel insulating layer. The sequential patterning of the blocking insulating layer, the charge-trap layer and the tunnel insulating layer to form the tunnel insulating layer pattern, the charge-trap layer pattern and the blocking insulating layer pattern that are sequentially stacked may use the spacer and the gate electrode as an etch mask.

BRIEF DESCRIPTION OF THE FIGURES

The accompanying figures are included to provide a further understanding of embodiments of the present invention, and are incorporated in and constitute a part of this specification. The drawings illustrate embodiments of the present invention and, together with the description, serve to explain principles of the present invention. In the figures.

DETAILED DESCRIPTION

Figure 1:
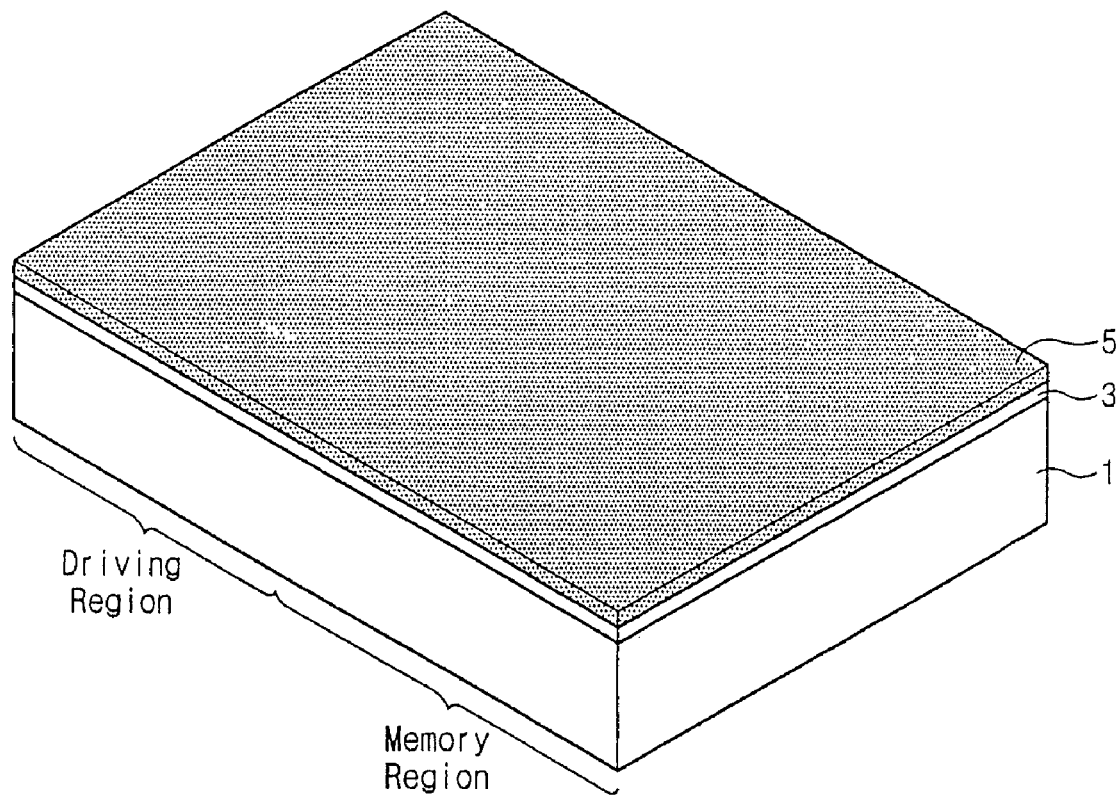
FIGS. 1 through 7, and FIGS. 9 through 11 are perspective views illustrating operations of forming a charge-trap type non-volatile memory device according to some embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these, terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

FIGS. 1 through 7 and FIGS. 9 through 11 are perspective views illustrating operations of forming a charge-trap type non-volatile memory device according to some embodiments of the present invention.

Referring to FIG. 1, a tunnel insulating layer 3 and a charge-trap layer 5 are sequentially formed on a semiconductor substrate 1 including a driving region and a memory region. The tunnel insulating layer 3 may be a silicon oxide layer formed by thermal oxidation. The tunnel insulating layer 3 may be a layer of a high dielectric material such as a hafnium oxide layer, an aluminum oxide layer, a hafnium aluminum oxide layer, and/or a zirconium oxide layer. The charge-trap layer 5 for example may be a silicon nitride layer ($Si_xN_y$). A ratio of silicon to nitrogen of the silicon nitride layer ($Si_xN_y$) may vary. The charge-trap layer 5 may be formed, for example, using chemical vapor deposition (CVD). The memory region refers to a region where transistors including the charge-trap layer are formed, that is, a region where cell memory transistors (or word lines) are formed. The driving region may be a region where transistors that do not include the charge-trap layer (for example, driving transistors for driving the cell memory transistors) are formed. The driving region may be a peripheral circuit region or a region where a selection line (such as a string selection line or a ground selection line) is formed in a NAND type non-volatile memory device.

Figure 2:
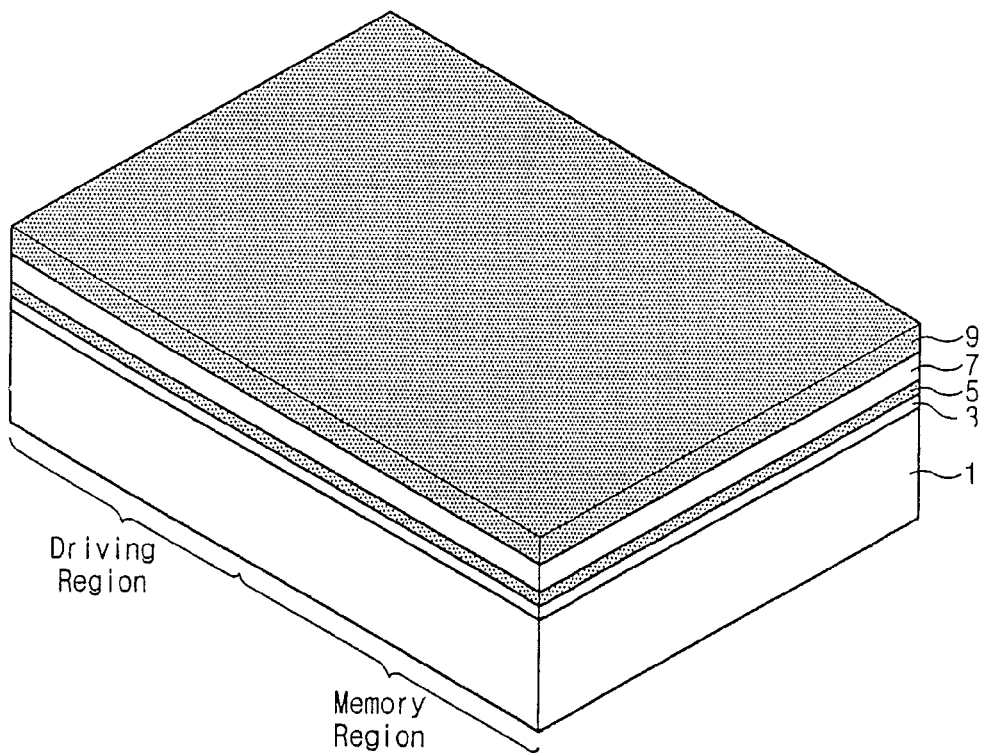

Referring to FIG. 2, a passivation layer 7 and a planarization stop layer 9 may be sequentially formed on the charge-trap layer 5. The planarization stop layer 9 may be formed of a material having an etch selectivity with respect to a device isolation layer to be formed later. The planarization stop layer 9 may be, for example, a silicon nitride layer. The passivation layer 7 may protect the charge-trap layer 5, and may release stress between the planarization stop layer 9 and the charge-trap layer 5. The passivation layer 7 may be formed of a material having an etch selectivity with respect to the charge-trap layer 5 (such as a medium temperature oxide (MTO)).

Figure 3:
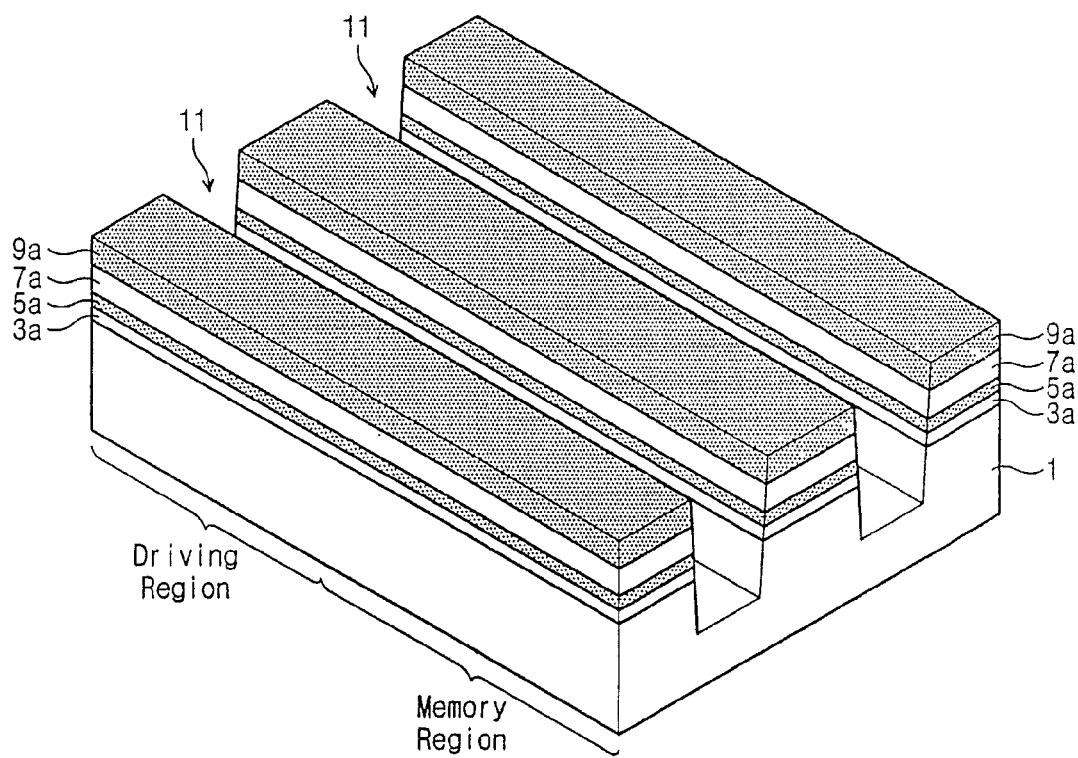

Referring to FIG. 3, a photoresist pattern (not shown) may be formed on the planarization stop layer 9. Portions of the planarization stop layer 9, the passivation layer 7, the charge-trap layer 5, the tunnel insulating layer 3, and the semiconductor substrate 1 may be sequentially etched using the photoresist pattern (not shown) as an etch mask, thereby forming trenches 11 and simultaneously forming tunnel insulating patterns 3a, charge-trap patterns 5a, passivation layer patterns 7a and planarization stop patterns 9a in sequence. Although the trench 11 of a line type may be formed across the driving region and the memory region as shown in FIG. 3, the trench can be formed in various other manners. After the trench 11 is formed, the photoresist pattern (not shown) is removed.

Figure 4:
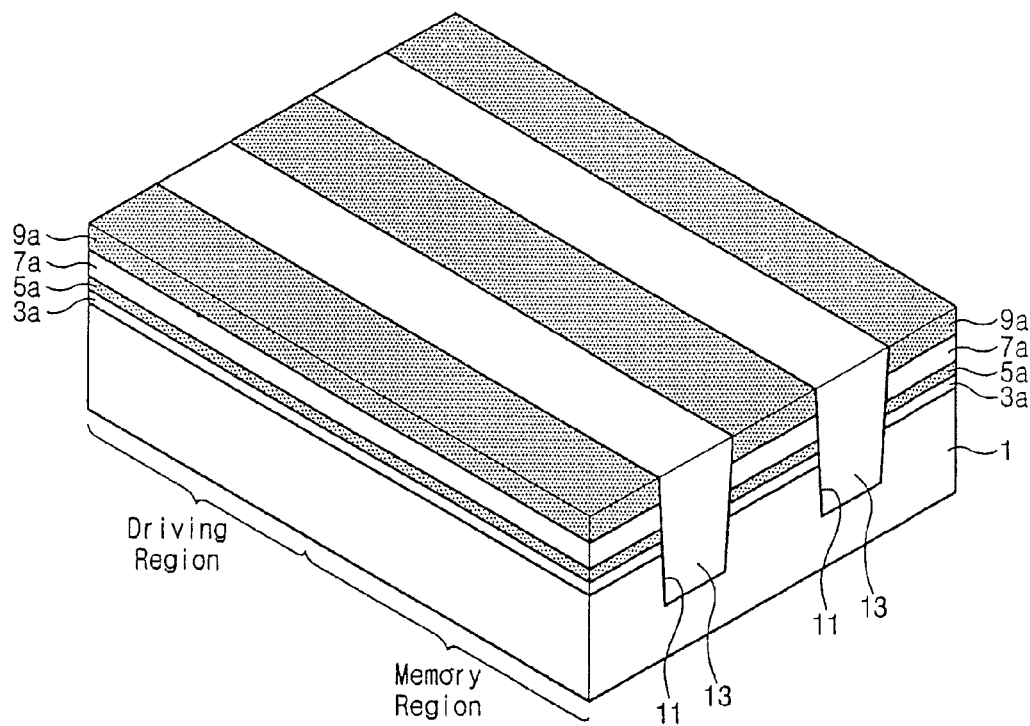

Referring to FIG. 4, a insulating layer (not shown) may be formed on an entire surface of the semiconductor substrate 1 including the trenches 1, such that the trenches 11 are filled with the insulating layer (not shown). Various types of oxide layers may be used as the insulating layer, such as a high density plasma (HDP) oxide layer, an undoped silicate glass, or the like. Before the insulating layer (not shown) is formed, a thermal oxidation process may be performed on the semiconductor substrate 1 including the trenches 11 to remove etching damage caused by the trench formation and to form a conformal thermal oxide layer on inner walls of the trenches 11. A planarization process may be performed on the insulating layer (not shown) to expose the planarization stop patterns 9a and to simultaneously form temporary device isolation layers 13 in the trenches 11.

Figure 5:
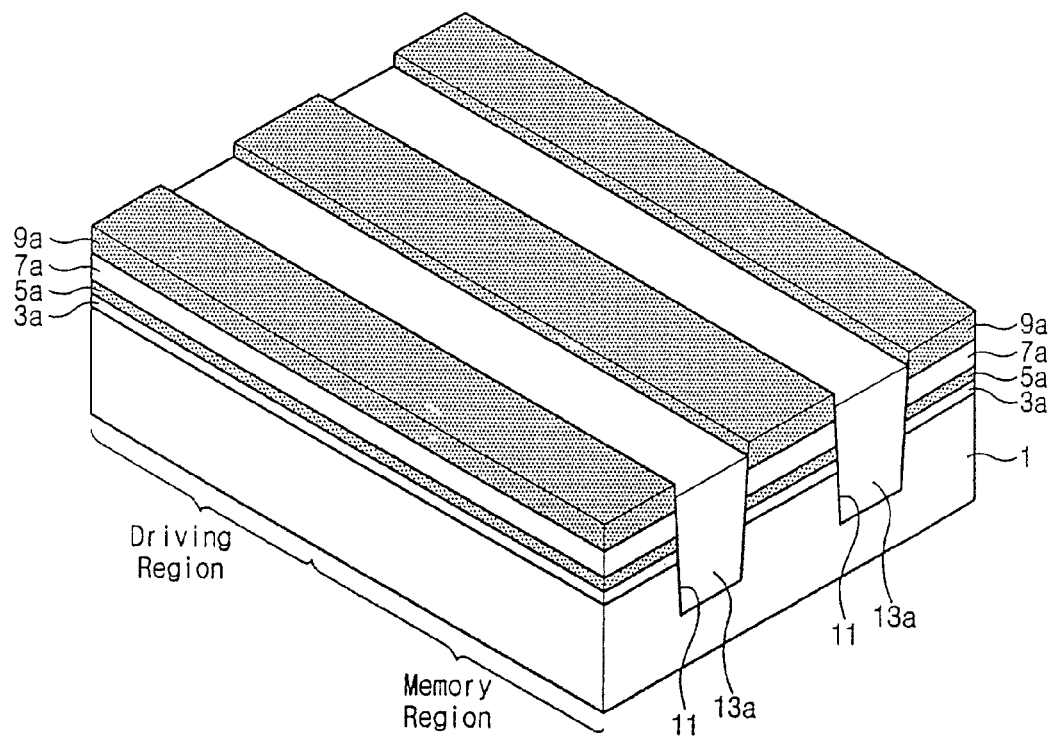

Referring to FIG. 5, upper portions of the temporary device isolation layers 13 may be partially recessed to expose at least portions of sidewalls of the planarization stop patterns 9a. Here, the sidewalls of the planarization stop patterns 9a may be entirely exposed, while sidewalls of the passivation layer patterns 7a are not exposed. In such a manner, device isolation layers 13a are formed.

Figure 6:
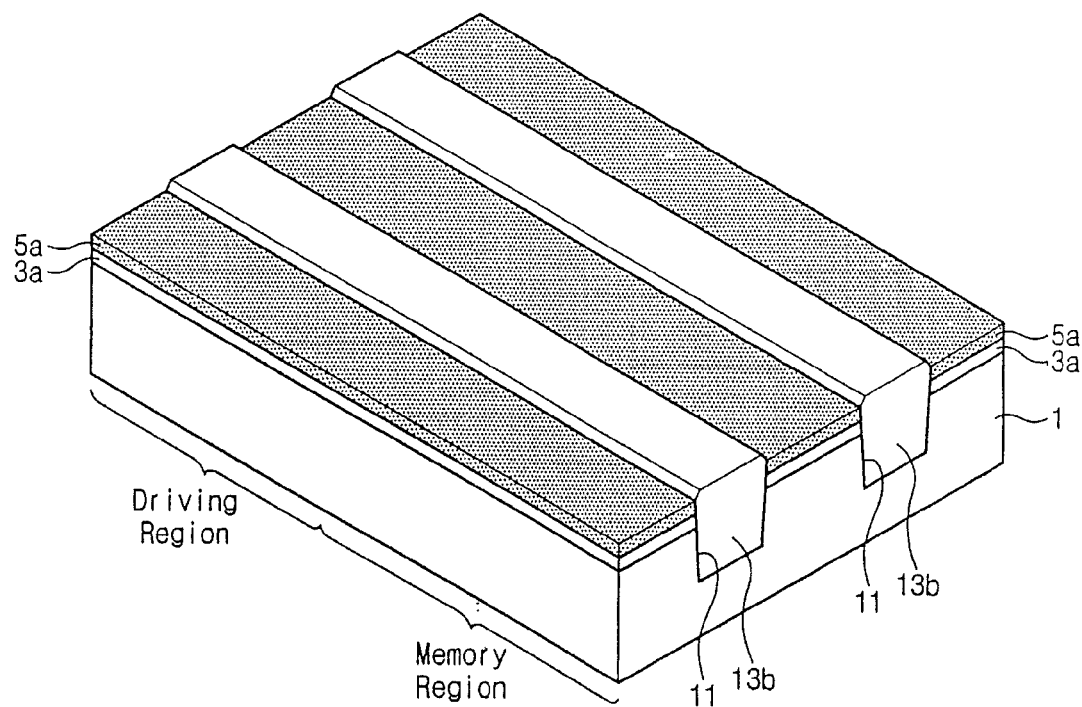

Referring to FIGS. 5 and 6, the planarization stop patterns 9a may be removed to expose the passivation layer patterns 7a. When the planarization stop pattern 9a is formed of silicon nitride, phosphoric acid may be used to remove the planarization stop pattern 9a. Then, the exposed passivation layer patterns 7a may be removed. When the passivation layer patterns 7a and the device isolation layers 13a are formed of a same oxide based material, upper portions of the device isolation layers 13a may be partially removed when the passivation layer patterns 7a are removed. Each of the device isolation layers 13b formed as discussed above may have a top surface higher than or on the same level as a top surface of the charge-trap pattern 5a. Accordingly, concentration of an electric field at an edge of an active region may be reduced during device operation, so that current leakage may be reduced.

Accordingly, charge-trap patterns 5a may be self-aligned with respective device isolation layers 13b.

Figure 7:
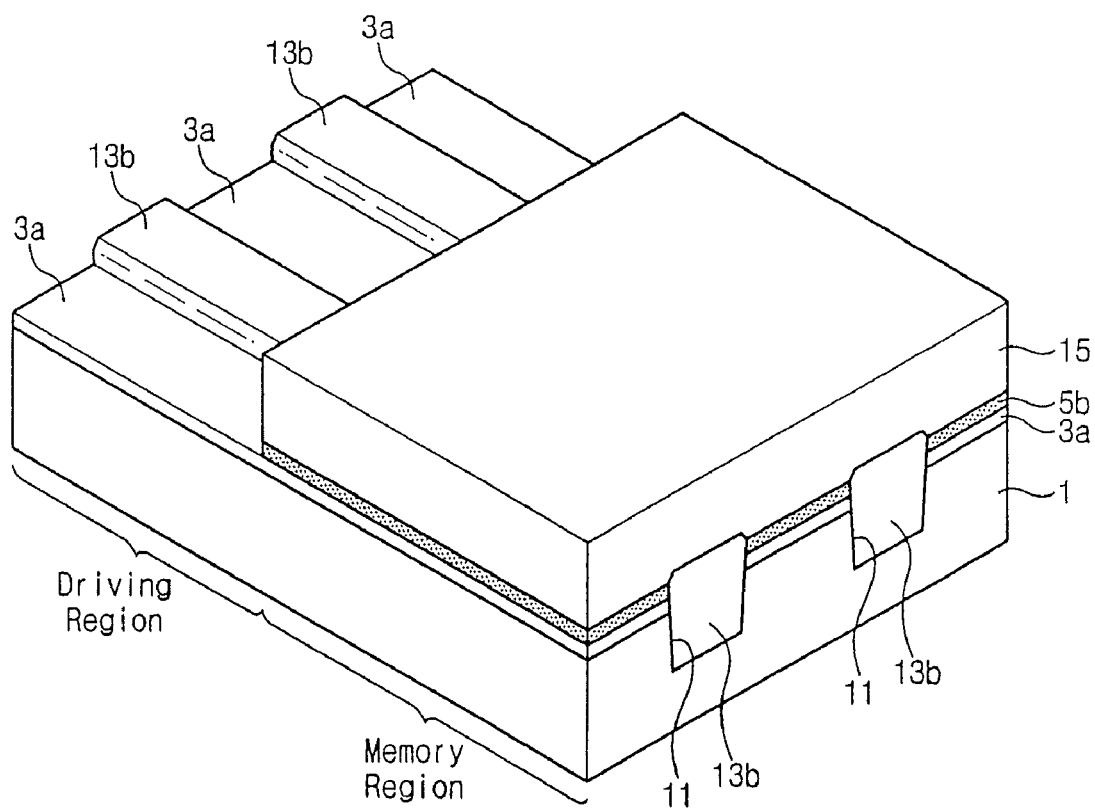

Referring to FIG. 7, a mask pattern 15 may be formed on the semiconductor substrate 1 including the device isolation layers 13b. The mask pattern 15 may expose the driving region while covering the memory region. The mask pattern 15 may be, for example, a photoresist pattern. Portions of the charge-trap patterns 5a exposed in the driving region may be removed using the mask pattern 15 as an etch mask. Thus, charge-trap patterns 5b may remain on the memory region, and the tunnel insulating patterns 3a may be exposed in the driving region.

Figure 8:
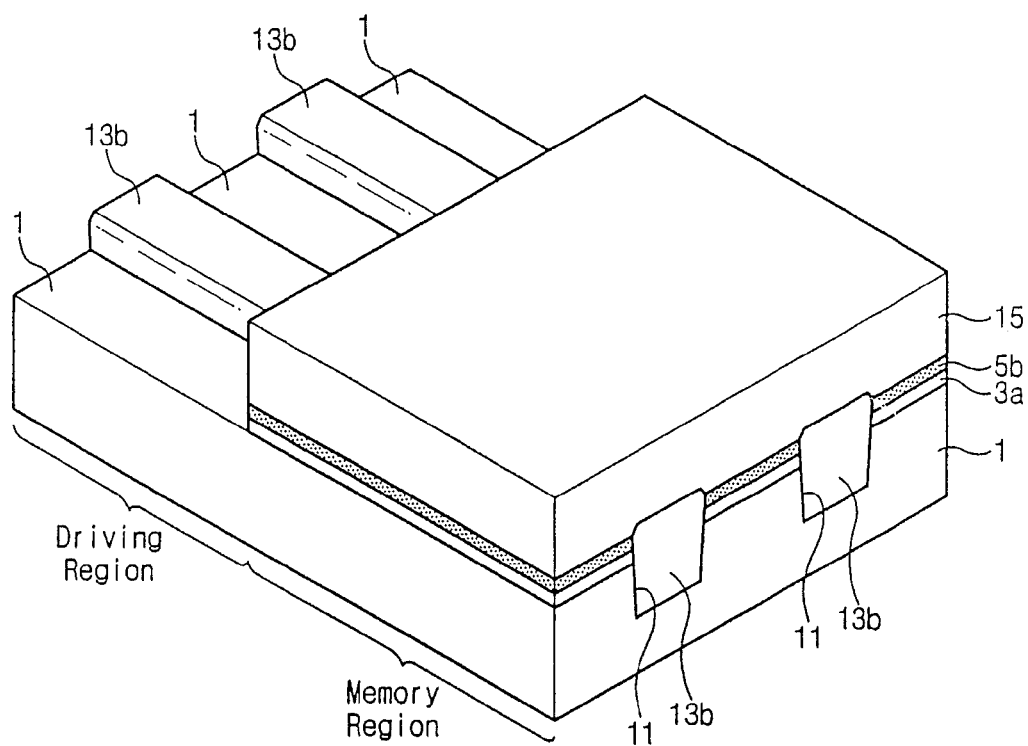
FIG. 8 is a perspective view illustrating operations of forming a charge-trap type non-volatile memory device according to other embodiments of the present invention.

According to other embodiments of the present invention, as illustrated in FIG. 8, portions of the tunnel insulating patterns 3a exposed in the driving region may also be removed, using the mask pattern 15 as an etch mask, thereby exposing portions of the semiconductor substrate 1 in the driving region.

Figure 9:
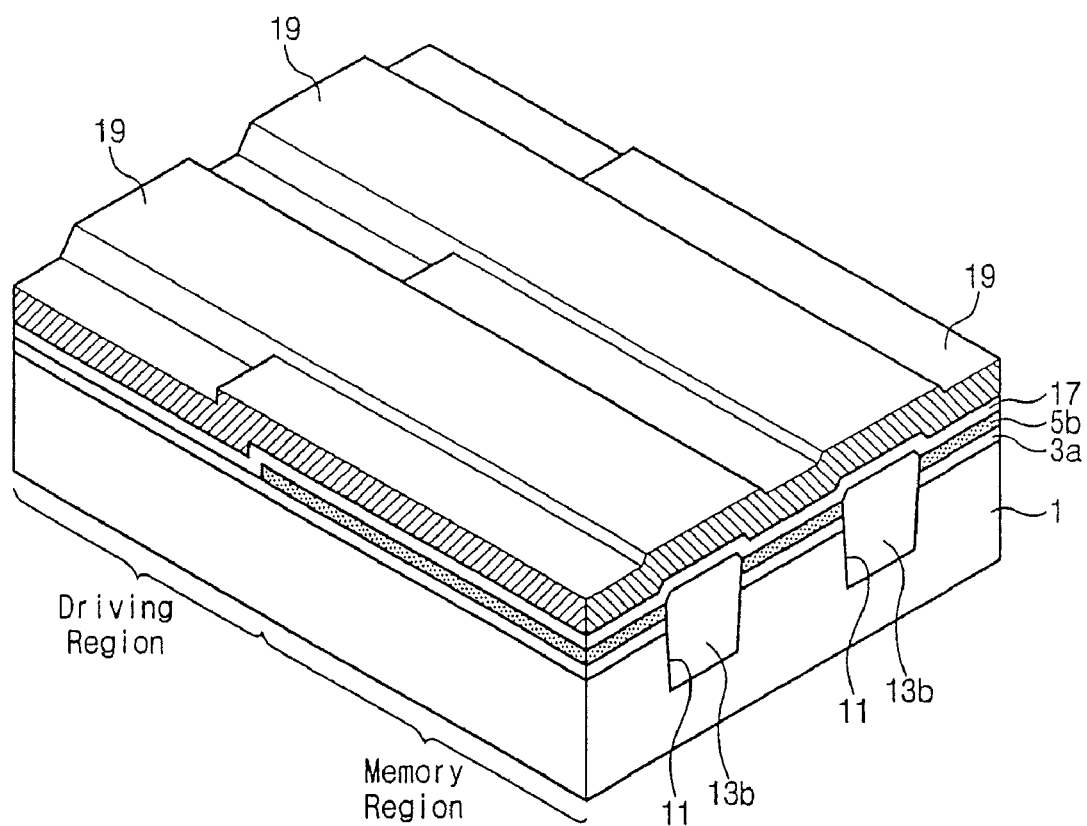

Referring to FIGS. 7 and 9, the mask pattern 15 may be removed in a state where the tunnel insulating patterns 3a are exposed in the driving region. Thus, the charge-trap patterns 5b may be exposed in the memory region. Then, a blocking insulating layer 17 and a gate electrode layer 19 may be sequentially formed on an entire surface of the semiconductor substrate 1. The blocking insulating layer 17 may be formed of a material having a higher dielectric constant than that of silicon oxide. The blocking insulating layer 17, for example, may be a layer of a high dielectric material such as hafnium oxide, aluminum oxide, hafnium aluminum oxide, and/or zirconium oxide. The gate electrode layer 19 may be formed of a material having a higher work function than that of polysilicon, and may be, for example, a metal containing layer. The gate electrode layer 19, for example, may include TaN, WN and/or W.

Figure 10:
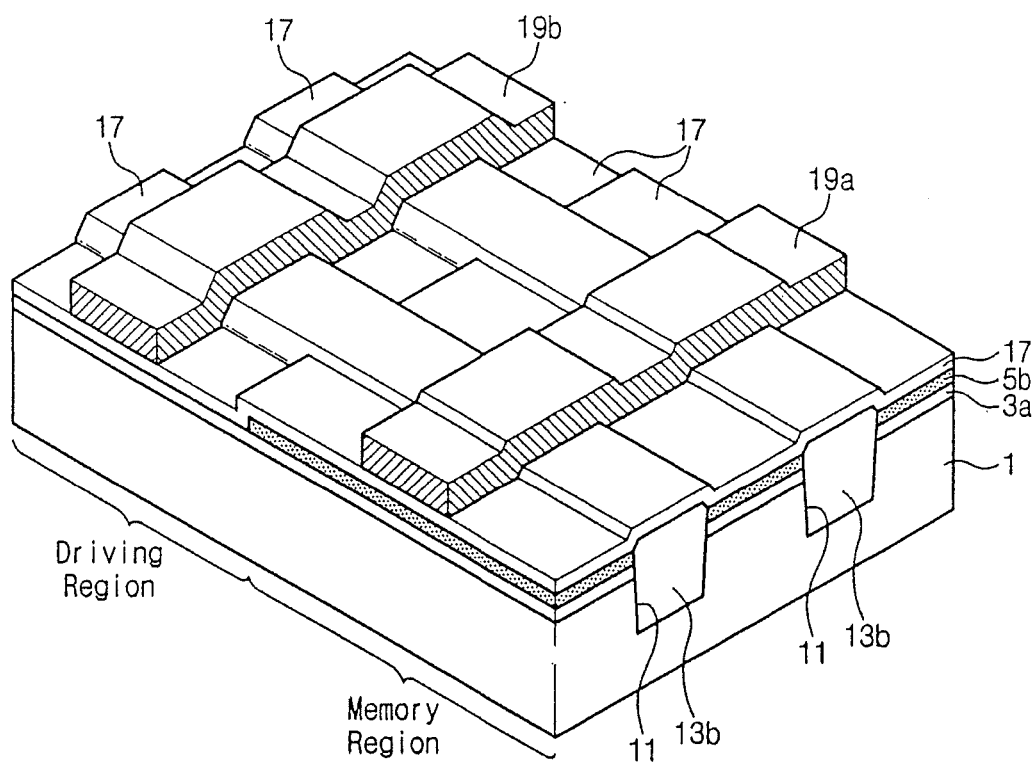

Referring to FIGS. 9 and 10, a capping layer pattern (not shown) may be formed on the gate electrode layer 19, and the gate electrode layer 19 may be etched using the capping layer pattern as an etch mask. Thus, a driving gate line 19b may be formed on the driving region and a word line 19a may be formed on the memory region at the same time. The driving gate line 19b may be a peripheral circuit gate electrode, a string selection line, and/or a ground selection line.

Figure 11:
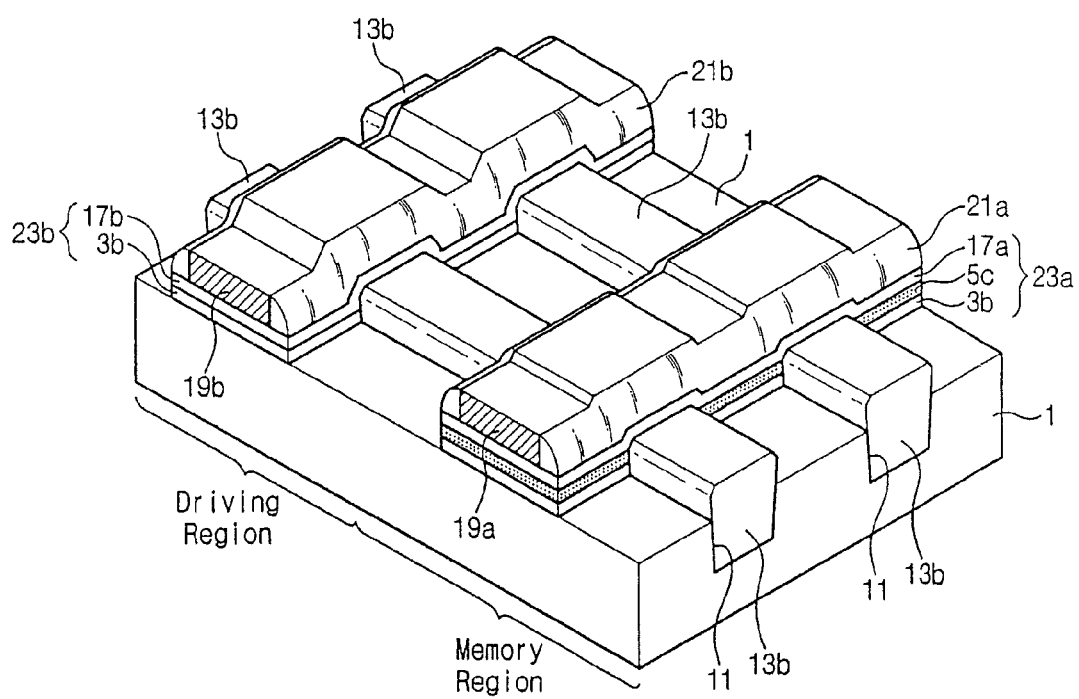

Referring to FIGS. 10 and 11, a spacer layer (not shown) may be conformally formed on an entire surface of the semiconductor substrate 1 including the driving gate line 19b and the word line 19a. Then, the spacer layer may be anisotropically etched to form first spacers 21a and a second spacers 21b that cover sidewalls of the word line 19a and the driving gate line 19b, respectively. The spacers 21a and 21b may also cover sidewalls of a capping layer pattern(s) (not shown). Then, the blocking insulating layer 17, the charge-trap patterns 5b and the tunnel insulating patterns 3a may be etched using the lines 19a and 19b and the spacers 21a and 21b as etch masks, to expose portions of the semiconductor substrate 1 and the device isolation layers 13b that are adjacent to each of the lines 19a and the 19b. Thus, in the driving region, driving gate insulating layers 23b, each including a tunnel insulating pattern 3b and a driving blocking insulating pattern 17b that are sequentially stacked, may be formed under the driving gate line 19b and the second spacers 21b. At the same time in the memory region, memory gate insulating layers 23a, each including a tunnel insulating pattern 3b, a charge-trap pattern 5c, and a blocking insulating pattern 17a, may be formed under the word line 19a and the first spacers 21a. The blocking insulating patterns 17a and 17b may be partially damaged by the etching process. However, since the damaged sidewalls of the blocking insulating patterns 17a and 17b may be separated from the lines 19a and 19b while contacting sidewalls of the spacers 21a and 21b, respectively, a breakdown current through the damaged sidewalls of the blocking insulating patterns 17a and 17b may be reduced during device operation.

When the driving gate line 19b is a peripheral circuit gate electrode, the driving gate insulating layer 23b may be referred to as a peripheral circuit gate insulating layer. When the driving gate line 19b is a selection line (such as a string selection line or a ground selection line) the driving gate insulating layer 23b may be referred to as a selection gate insulating layer.

A charge-trap type non-volatile memory device according to some embodiments of the present invention will now be described with reference to FIG. 11. In the memory region, the charge-trap type patterns 5c may be isolated from each other by the device isolation layers 13b, and may individually exit in corresponding memory cell transistors. Accordingly, flow of charge trapped in one charge-trap pattern 5c to another charge-trap pattern 5c of an adjacent cell transistor may be reduced, and threshold voltage drop may be reduced. Also, since the device isolation layer 13 may have a top surface which is higher than or on the same level as a top surface of the charge-trap pattern 5c, concentration of an electric field at an edge of an active region may be reduced during device operation, thereby reducing current leakage. Also, since the driving gate insulating layer 23b in the driving region does not include the charge-trap pattern 5c, soft programming of driving transistors may be reduced when the cell memory transistors are programmed, and thus the driving transistors may be driven at a relatively low voltage. As shown in FIG. 11, the driving gate insulating layer(s) 23b of FIG. 11 may be a double layer including the tunnel insulating pattern 3b and the blocking insulating pattern 17b. If the tunnel insulating layer 3a is removed in the driving region as shown in FIG. 8, however, the driving gate insulating layer 23b may be a single layer including the blocking insulating pattern 17b (without the tunnel insulating layer 3b).

Also, the blocking insulating pattern 17b may be formed of a high dielectric material, and the word line 19a may be formed of a material having a high work function, so that defective erase operations may be reduced.

A charge-trap type non-volatile memory device according to some embodiments of the present invention may thus provide improved reliability.

In charge-trap type non-volatile memory devices, according to some embodiments of the present invention, charge-trap type patterns may be isolated from each other by the device isolation layers, and may individually exit in corresponding memory cell transistors. Accordingly, flow of charge trapped in one charge-trap pattern to another charge-trap pattern of an adjacent cell transistor may be reduced. Also, since the device isolation layer may have a top surface which is higher than or on the same level as a top surface of the charge-trap pattern, concentration of an electric field at an edge of an active region may be reduced during device operation, so that current leakage may be reduced. Also, since the driving gate insulating layer in the driving region may not include the charge-trap pattern, soft programming of driving transistors may be reduced when the cell memory transistors are programmed, and thus the driving transistors may be driven at a relatively low voltage. Also, since the blocking insulating pattern may be formed using spacers covering sidewalls of the word line as an etch mask, damaged portions of the blocking insulating pattern may not contact the word line even though the sidewall portions thereof may be damaged. Therefore, breakdown voltage may be reduced. Also, the blocking insulating pattern may be formed of a high dielectric material, and the word line may be formed of a material having a high work function, so that defective erase operations may be reduced. Accordingly, charge-trap type non-volatile memory devices according to some embodiments of the present invention may provide improved reliability.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A method of forming a non-volatile memory device, the method comprising:
    forming a tunnel insulating layer on a semiconductor substrate, wherein the semiconductor substrate comprises a cell array region and a peripheral circuit region;
    forming a charge-trap layer on the tunnel insulating layer;
    forming a trench extending through the tunnel insulating layer and the charge-trap layer and into the semiconductor substrate so that portions of the charge-trap layer and the tunnel insulating layer remain on opposite sides of the trench;
    forming a device isolation layer in the trench;
    removing portions of the charge-trap layer on the peripheral circuit region of the semiconductor substrate while maintaining portions of the charge-trap layer on the cell array region of the semiconductor substrate;
    after removing portions of the charge-trap layer, forming a blocking insulating layer on the device isolation layer and on remaining portions of the charge-trap layer;
    forming a gate electrode on the blocking insulating layer; and
    patterning the blocking insulating layer and remaining portions of the charge-trap layer to provide a blocking insulating pattern and a charge-trap pattern between the gate electrode and the semiconductor substrate.

2. A method according to claim 1 wherein the blocking insulating layer comprises a layer of a material having a dielectric constant higher than that of silicon oxide.

3. A method according to claim 1 wherein the gate electrode comprises a material having a work function higher than that of polysilicon.

4. A method according to claim 1 wherein the gate electrode comprises a metal.

5. A method according to claim 1 further comprising:
    before forming the trench, forming a passivation layer on the charge-trap layer and forming a planarization stop layer on the passivation layer, wherein forming the trench further comprises foiming the trench through the planarization stop layer and the passivation layer.

6. A method according to claim 5 wherein forming the device isolation layer comprises,
    forming an insulating layer on remaining portions of the planarization stop layer and in the trench,
    planarizing the insulating layer to expose the planarization stop layer while maintaining portions of the insulating layer in the trench, and
    removing the planarization stop layer and the passivation layer.

7. A method according to claim 6 wherein removing the passivation layer comprises removing a portion of the device isolation layer.

8. A method according to claim 1 wherein the charge-trap pattern is recessed relative to a surface of the device isolation layer opposite the substrate.

9. A method of forming a non-volatile memory device, the method comprising:
    forming a tunnel insulating layer on a semiconductor substrate;
    forming a charge-trap layer on the tunnel insulating layer;
    forming a trench extending through the tunnel insulating layer and the charge-trap layer and into the semiconductor substrate so that portions of the charge-trap layer and the tunnel insulating layer remain on opposite sides of the trench;
    forming a device isolation layer in the trench;
    forming a blocking insulating layer on the device isolation layer and on remaining portions of the charge-trap layer;
    forming a gate electrode on the blocking insulating layer;
    forming spacers on sidewalls of the gate electrode; and
    after forming the spacers on the sidewalls of the gate electrode, patterning the blocking insulating layer and remaining portions of the charge-trap layer to provide a blocking insulating pattern and a charge-trap pattern between the gate electrode and the semiconductor substrate, wherein patterning the blocking insulating layer and remaining portions of the charge-trap layer comprises patterning the blocking insulating layer and remaining portions of the charge-trap layer using the spacers as an etch mask.

10. A method according to claim 9, wherein the semiconductor substrate comprises a cell array region and a peripheral circuit region, the method further comprising:

before forming the blocking insulating layer, removing portions of the charge-trap layer on the peripheral circuit region of the semiconductor substrate while maintaining portions of the charge-trap layer on the cell array region of the semiconductor substrate.

11. A method according to claim 9 wherein the blocking insulating layer comprises a layer of a material having a dielectric constant higher than that of silicon oxide.

12. A method according to claim 9 wherein the gate electrode comprises a material having a work function higher than that of polysilicon.

13. A method according to claim 9 wherein the gate electrode comprises a metal.

14. A method according to claim 9 further comprising:

before forming the trench, forming a passivation layer on the charge-trap layer and forming a planarization stop layer on the passivation layer, wherein forming the trench further comprises forming the trench through the planarization stop layer and the passivation layer.

15. A method according to claim 14 wherein forming the device isolation layer comprises, forming an insulating layer on remaining portions of the planarization stop layer and in the trench, planarizing the insulating layer to expose the planarization stop layer while maintaining portions of the insulating layer in the trench, and removing the planarization stop layer and the passivation layer.

16. A method according to claim 15 wherein removing the passivation layer comprises removing a portion of the device isolation layer.

17. A method according to claim 9 wherein the charge-trap pattern is recessed relative to a surface of the device isolation layer opposite the substrate.

* * * * *